(12) United States Patent
Dai et al.

(10) Patent No.: US 10,902,755 B2
(45) Date of Patent: Jan. 26, 2021

(54) STRETCHABLE DISPLAY SUBSTRATE, METHOD FOR MANUFACTURING STRETCHABLE DISPLAY SUBSTRATE, AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Weinan Dai, Beijing (CN); Yingsong Xu, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/585,443

(22) Filed: Sep. 27, 2019

(65) Prior Publication Data
US 2020/0105170 A1    Apr. 2, 2020

(30) Foreign Application Priority Data
Sep. 29, 2018   (CN) .......................... 2018 1 1148865

(51) Int. Cl.
*G09G 3/20*    (2006.01)
*G09F 9/30*    (2006.01)
*H01L 27/32*   (2006.01)

(52) U.S. Cl.
CPC ............ *G09F 9/301* (2013.01); *H01L 27/326* (2013.01); *H01L 27/3246* (2013.01)

(58) Field of Classification Search
CPC .... G09F 9/301; H01L 27/3246; H01L 27/326
(Continued)

(56) References Cited

U.S. PATENT DOCUMENTS 9,730,330 B1    8/2017   Boyle et al.
2009/0289548 A1   11/2009   Maruyama et al.
(Continued)

FOREIGN PATENT DOCUMENTS

CN    202018547 U    10/2011
CN    107221549 A    9/2017
(Continued)

OTHER PUBLICATIONS

First Office Action for Chinese Application No. 201811148865.7, dated May 6, 2020, 9 Pages.

*Primary Examiner* — Jonathan M Blancha
(74) *Attorney, Agent, or Firm* — Brooks Kushman P.C.

(57) ABSTRACT

A stretchable display substrate, a method for manufacturing the stretchable display substrate, and a display device are provided. The stretchable display substrate includes: a base substrate on which a plurality of isolated regions and a plurality of connection regions are distributed, wherein the isolated regions are connected to each other through the connection regions; a plurality of display pixel units arranged in a first array, wherein at least a respective one of the display pixel units is arranged on each of the isolated regions, at least one of the display pixel units includes an independent cathode, and the independent cathode is separated from any cathode of the other display pixel units; and at least one wire configured to be electrically connected to the independent cathode.

17 Claims, 3 Drawing Sheets

(58) Field of Classification Search
USPC .......................................................... 345/55
See application file for complete search history.

(56) References Cited

U.S. PATENT DOCUMENTS

| | | | |
|---|---|---|---|
| 2016/0268352 A1* | 9/2016 | Hong | H01L 27/326 |
| 2016/0293571 A1* | 10/2016 | Yoon | H01L 25/048 |
| 2017/0278920 A1 | 9/2017 | Park et al. | |
| 2017/0288168 A1* | 10/2017 | Kim | H01L 51/5253 |
| 2018/0190190 A1* | 7/2018 | Xi | G09G 3/3208 |
| 2019/0204872 A1* | 7/2019 | Lee | G06F 1/1643 |

FOREIGN PATENT DOCUMENTS

| | | |
|---|---|---|
| CN | 108054173 A | 5/2018 |
| CN | 108598125 A | 9/2018 |

\* cited by examiner

STRETCHABLE DISPLAY SUBSTRATE, METHOD FOR MANUFACTURING STRETCHABLE DISPLAY SUBSTRATE, AND DISPLAY DEVICE

CROSS-REFERENCE TO RELATED APPLICATIONS

The present application claims priority of Chinese Patent Application No. 201811148865.7 filed in China on Sep. 29, 2018, which is incorporated herein by reference in its entirety.

TECHNICAL FIELD

The present disclosure relates to the field of display technologies, and in particular to a stretchable display substrate, a method for manufacturing the stretchable display substrate, and a display device.

BACKGROUND

Stretchable operation of a stretchable display device designed for a flexible substrate is mainly accomplished by deformable characteristics of the flexible substrate, and types of flexible substrate of the stretchable display device mainly includes a stretchable substrate and a non-stretchable (but deformable) substrate.

SUMMARY

An object of the present disclosure is to provide a stretchable display substrate, a method for manufacturing the stretchable display substrate, and a display device.

The technical solutions provided by the disclosure are as follows.

The present disclosure provides a stretchable display substrate including: a base substrate on which a plurality of isolated regions and a plurality of connection regions are distributed, wherein the isolated regions are connected to each other through the connection regions; a plurality of display pixel units arranged in a first array, wherein at least a respective one of the display pixel units is arranged on each of the isolated regions, at least one of the display pixel units includes an independent cathode, and the independent cathode is separated from any cathode of the other display pixel units; and at least one wire configured to be electrically connected to the independent cathode.

In an embodiment of the present disclosure, a plurality of first division regions and a plurality of second division regions are arranged on the base substrate, wherein the first division regions intersect the second division regions, the first division regions and the second division regions are not directly connected to each other, the base substrate is divided into the isolated regions arranged in a second array and the connection regions through the first division regions and the second division regions.

In an embodiment of the present disclosure, there is an oblique angle between a generally extending direction of the wire and an extending direction of the first division region.

In an embodiment of the present disclosure, the isolated region is of a rectangle, two opposite sides of the rectangle are parallel to the extending direction of the first division region, and the other two opposite sides of the rectangle are parallel to the extending direction of the second division region.

In an embodiment of the present disclosure, wires configured to be electrically connected to adjacent isolated regions are of an equal length, the wire for the display pixel units in a same row is of a shape of a zigzag line, the zigzag line includes a plurality of first line segments and a plurality of second line segments, the first line segments and the second line segments are connected to each other alternately, the first line segments are parallel to the extending direction of the first division region, and the second line segments are parallel to the extending direction of the second division region.

In an embodiment of the present disclosure, each of at least part of the plurality of display pixel units further includes an anode arranged opposite to the cathode, and a light-emitting layer arranged between the anode and the cathode, and the at least one wire includes a first wire and a second wire, wherein the anodes are connected through the first wire arranged on the connection regions and the isolated regions, and the cathodes are connected through the second wire arranged on the connection regions and the isolated regions.

In an embodiment of the present disclosure, the first wire, the second wire, and the anode are arranged in a same layer and made of a same material.

In an embodiment of the present disclosure, the stretchable display substrate further includes: an encapsulation layer, wherein the anode, the cathode, and the light-emitting layer in each of the display pixel units are separately encapsulated by the encapsulation layer.

In an embodiment of the present disclosure, each of the plurality of display pixel units further includes: a connection electrode configured to be electrically connected to the second wire; and a convex structure arranged on a side of the connection electrode distal to the base substrate, wherein the convex structure is arranged at a periphery of the light-emitting layer, a back plate is arranged on the base substrate, and the convex structure includes a portion of an pixel definition layer arranged on a side of the back plate distal to the base substrate, and a planarization layer arranged on a side of the portion of the pixel definition layer distal to the back plate. The convex structure is separated from the connection electrode and the cathode, the cathode is arranged on a side of the anode distal to the base substrate, and the cathode is configured to be in direct physical contact with and electrically connected to the connection electrode.

In an embodiment of the present disclosure, the oblique angle is about 45 degrees.

In an embodiment of the present disclosure, the first division regions and the second division regions are hollow regions formed in the base substrate.

In an embodiment of the present disclosure, the hollow regions are filled with an elastic material.

In an embodiment of the present disclosure, the first division regions and the second division regions are strip-shaped regions.

In an embodiment of the present disclosure, the plurality of first division regions are arranged in a plurality of first rows that are parallel to each other, and in each of the plurality of first rows, at least two corresponding first division regions of the plurality of first division regions are arranged along an extending direction of the first row; and the plurality of second division regions are arranged in a plurality of first columns that are parallel to each other, and in each of the plurality of first columns, at least two corresponding second division regions of the plurality of second division regions are arranged along an extending direction of the first column.

In an embodiment of the present disclosure, one of the first division regions located in one of the first rows and another one of the first division regions located in another one of the first rows adjacent to the one of the first rows are staggered, and one of the second division regions located in one of the first columns and another one of the second division regions located in another one of the first columns adjacent to the one of the first columns are staggered.

In an embodiment of the present disclosure, the first row is perpendicular to the first column.

In an embodiment of the present disclosure, shapes of the plurality of first division regions are same, and shapes of the plurality of second division regions are same; one or more of the connection regions are directly connected to the isolated regions, the first division regions, and the second division regions.

The present disclosure further provides a display device including the above stretchable display substrate.

The present disclosure further provides a method for manufacturing a stretchable display substrate, including: providing a base substrate; forming a plurality of isolated regions and a plurality of connection regions on the base substrate, wherein the isolated regions are connected to each other through the connection regions; forming a plurality of display pixel units on the base substrate, wherein the display pixel units are arranged in a first array, at least a respective one of the display pixel units is arranged on each of the isolated regions, at least one of the display pixel units includes an independent cathode, and the independent cathode is separated from any cathode of the other display pixel units; and forming at least one wire, wherein the at least one wire is configured to be electrically connected to the independent cathode.

In an embodiment of the present disclosure, the at least one wire includes a first wire and a second wire, and forming the plurality of display pixel units on the base substrate and forming the at least one wire include: with respect to each of at least part of the plurality of display pixel units, forming the first wire, the second wire, and an anode through a single patterning process; and forming a light-emitting layer and the cathode sequentially on a side of the anode distal to the base substrate, wherein the first wire is formed in the connection regions and the isolated regions to connect the anodes, and the second wire is formed in the connection regions and the isolated regions to connect the cathodes.

DETAILED DESCRIPTION

Figure 1:
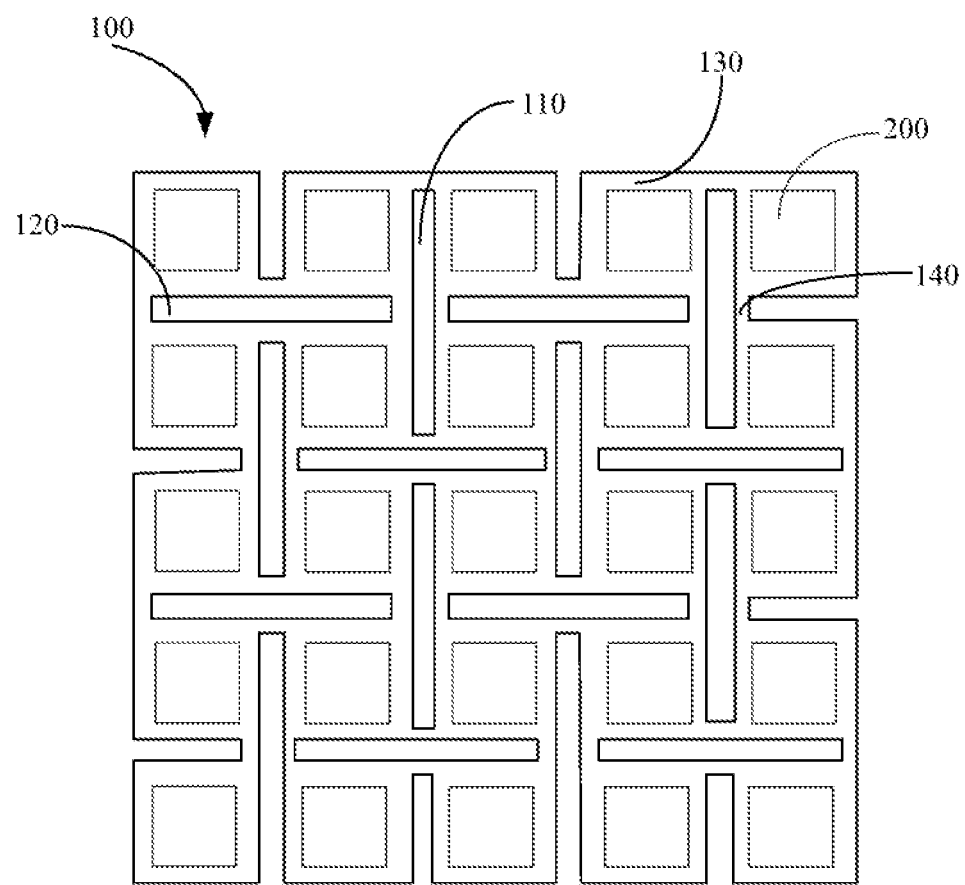
FIG. 1 is a schematic diagram showing a structure of a stretchable display substrate in an embodiment of the present disclosure.

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

Regardless of which of the above types of flexible substrate of the stretchable display device is employed, in order to ensure operational stability of a Thin Film Transistor (TFT) device during stretching operation of the stretchable display device, a region where the TFT device is located should be in a fixed manner (that is, the region where the TFT device is located remains stable in shape, i.e., a design of independent islands (i.e., isolated regions) is adopted) to prevent characteristics of the TFT device from changing due to displacement of the TFT device during the stretching operation, connection wires of the entire stretchable display device should be arranged at a stretchable structure, and the device is subjected to an evaporation process and an encapsulation process after a circuit portion has been formed.

In order to enable a screen of a stretchable display device to be stretchable in multiple directions, it is necessary to arrange division regions in two or more directions at certain angles to each other. In addition to satisfying tensile deformation in basic stretching directions (i.e., horizontal and vertical directions), in another direction (such as an oblique direction), simultaneous deformation of the division regions in two or more directions can also satisfy stretching in an oblique direction. Spacing between pixels in individual isolated regions gradually increases during stretching, so that an area of the display device changes.

Because the entire stretchable display device is made through a flexible process including flexible packaging, there is still possibility of image quality degradation of the stretchable display device as compared with a flat display. For example, in the related art, a cathode of the flat display is subjected to a whole-surface sputtering process, a level of the cathode is inputted at an edge. There are a sufficient width and a sufficient length to form a connection region, so that a stable and uniform potential is provided by the cathode. However, in the stretchable display device, if the cathode is subjected to the whole-surface sputtering process, since a resistance of the cathode is larger than that of a metal wire (its thickness is very thin to ensure transmittance), and a connection portion between the isolated regions is very small as compared to conductive area of the whole-surface cathode of the flat display in the related art; in addition, repeated deformation of a stretchable portion may cause aging and fatigue of a thinner cathode material, thereby increasing resistance of the cathode between the isolated regions, and resulting in uneven display effect. Therefore, if the cathode of the flat display in the related art is used in the stretchable display device through the whole-surface sputtering process, it is unable to provide a stable potential.

In view of the problem of unstable potential caused by electric connection of the whole-surface cathode at an edge of the screen in the stretchable display device of the related art, a stretchable display substrate and a method for manufacturing the stretchable display substrate, and a display device are provided in the embodiments of the present disclosure, so as to improve an electric connection of the cathode, and solve the problem of unstable potential caused by electric connection of the cathode at the edge of the screen.

As shown in FIG. 1 to FIG. 5, the stretchable display substrate is provided in the embodiments of the present disclosure, including: a base substrate 100 on which a plurality of first division regions 110 and a plurality of second division regions 120 are arranged, wherein the first division regions 110 intersect the second division regions 120, the first division regions 110 and the second division regions 120 are not directly connected to each other, the base substrate 100 is divided into a plurality of isolated regions 130 and a plurality of connection regions 140 through the first division regions 110 and the second division regions 120, and the isolated regions 130 are arranged in an array, and connected to each other through the connection regions 140; a plurality of display pixel units 200 arranged in an array, wherein at least a respective one of the display pixel units 200 is arranged on each of the isolated regions 130; and a plurality of wires configured to electrically connect the plurality of display pixel units 200. Each of at least part of the plurality of display pixel units 200 includes a first electrode 210 and a second electrode 220 arranged opposite to each other, and a light-emitting layer 230 arranged between the first electrode 210 and the second electrode 220. The plurality of wires includes a first wire 310 and a second wire 320, where the first electrodes 210 are connected through the first wire 310 arranged on the connection regions 140 and the isolated regions 130, and the second electrodes 220 are connected through the second wire 320 arranged on the connection regions 140 and the isolated regions 130.

When the first electrode 210 is an anode and the second electrode 220 is a cathode, the first electrode 210 and the second electrode 220 are made of different materials. The first electrode 210 may be an Mg/Ag material having high reflectivity, and the second electrode 220 may be a thin Indium Tin Oxide (ITO)/Ag/Indium Zinc Oxide (IZO) material having high light transmittance, so as to increase upward light transmittance.

Figure 2:
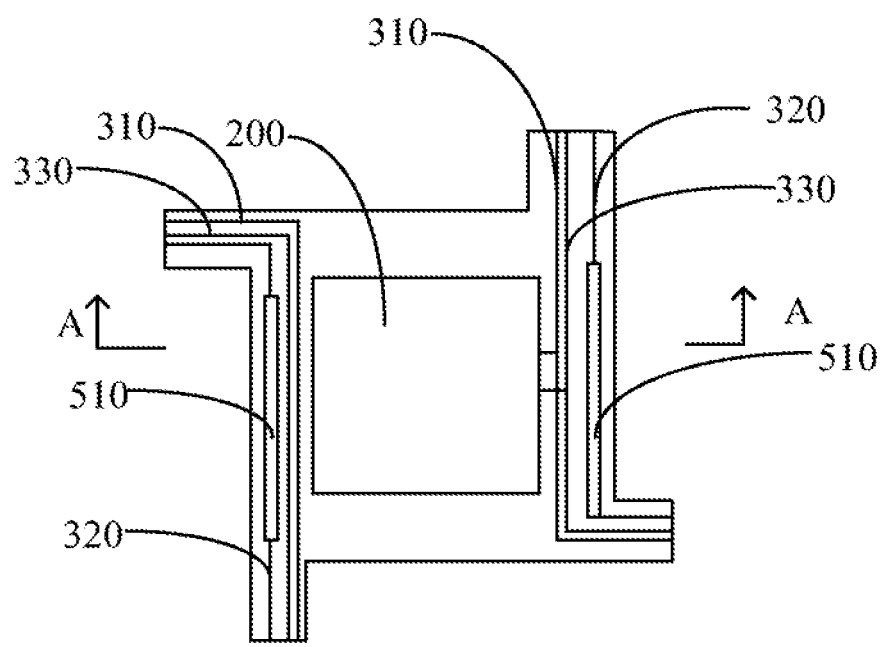
FIG. 2 is a schematic diagram showing a structure of an isolated region in FIG. 1.
Figure 3:
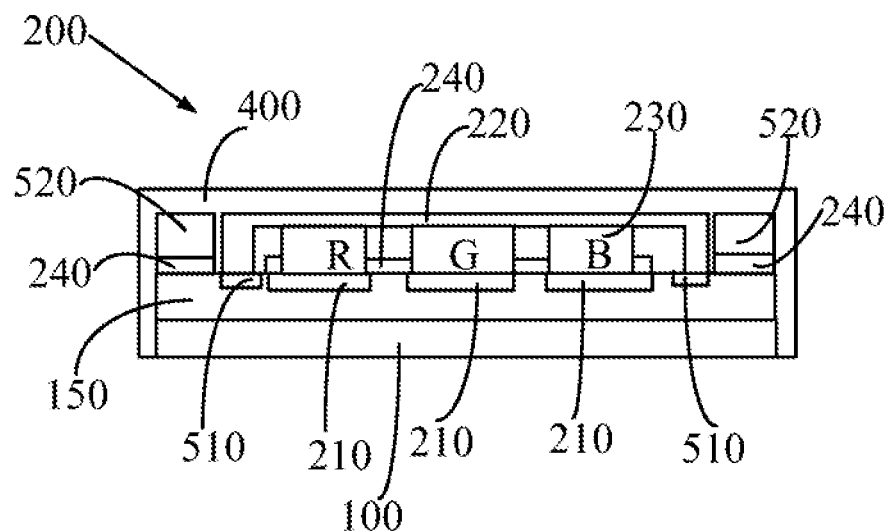
FIG. 3 is a cross-sectional view along a line A-A in FIG. 2.

In the above solution, the base substrate 100 is made of a flexible material, and a plurality of individual isolated regions 130 and the connection regions 140 connected between the isolated regions 130 are arranged on the base substrate 100, and a wire extends through the connecting regions 140 among the isolated regions 130. When subjected to an external force, a distance between the isolated regions 130 becomes larger, and the connecting regions 140 are still connected to each other to ensure integrity of the entire stretchable display substrate. Signal transmission of the first electrode 210 may be implemented through the first wire 310 arranged on the isolated regions and the connection regions. As compared to a flat display substrate in the related art, in the stretchable display substrate of the embodiments of the present disclosure, a connection part of the second electrode 220 (which can be used as a cathode) is redesigned, the connection region 140 between the isolated regions 130 is used as a transmission path of a signal line of the second electrode, and the second electrode 220 is no longer connected from the edge of the screen, but is connected and signaled through the wire on the connection region 140. FIG. 2 is an enlarged view of a structure of one isolated region 130 in FIG. 1, and FIG. 3 is a cross-sectional view along a line A-A in FIG. 2. As shown in FIGS. 2 and 3, one individual isolated regions 130 is provided with the first wire 310 (which can be used as an anode signal line) and the second wire 320 (which can be used as a cathode signal line). Since potentials of the second electrodes 220 of the entire stretchable display substrate can be regarded as being uniform, both ends of a same display pixel unit 200 can provide a same potential for the second electrode 220 through different connection regions 140. Thus, when the stretchable display substrate is stretched, even if a resistance of the second electrode 220 changes greatly, the wire corresponding to the second electrode 220 is still independently connected to the second electrode 220. Therefore, it can provide good bending fatigue resistance, and solve a problem that a voltage distal to an end of a driving Integrated Chip (IC) drops, so as to provide a stable potential.

It should be noted that, in the above solution, at least a respective one of the display pixel units 200 is arranged on each of the isolated regions 130. As shown in FIG. 1, a respective one of the display pixel units 200 may be correspondingly arranged on each of the isolated regions 130, or two or more of the display pixel units 200 may be correspondingly arranged on each of the isolated regions 130. In addition, the first electrodes in each of the display pixel units may be connected through the first wire, and the second electrodes in each of the display pixel units may be connected through the second wire; or the first electrodes in only a part of the display pixel units on the base substrate of the entire display device are connected through the first wire, and the second electrodes in only the part of the display pixel units on the base substrate of the entire display device are connected through the second wire. In addition, as shown in FIG. 2, the plurality of wires further includes a third wire 330, which represents various signal lines of the display pixel unit 200. A person skilled in the art may understand that although only one third wire 330 is shown in FIG. 3, a quantity of the third wires 330 may actually be more than one (for example, gate lines and data lines may be included), so as to separately transmit various other signals required for the display pixel unit 200. In addition, in FIG. 2, the first wire 310, the second wire 320, and the third wire 330 located on a right side of the display pixel unit 200 are used to provide the display pixel unit 200 with a corresponding anode potential, a corresponding cathode potential, and other various signals respectively, and the first wire 310, the second wire 320, and the third wire 330 located on a left side of the display pixel unit 200 in FIG. 2 are used to provide another display pixel unit 200 (not shown in FIG. 2) adjacent to the display pixel unit 200 with a corresponding anode potential, a corresponding cathode potential, and other various signals respectively. The first wires 310 on the left side and the right side in FIG. 2 are in parallel connection to reduce a resistance of the anode wire in an entire pixel region of the display panel.

In an optional embodiment provided by the present disclosure, as shown in FIGS. 2 and 3, the first wire 310, the second wire 320, and the first electrodes 210 are arranged in a same layer and made of a same material; and a back plate 150 is further arranged on the base substrate 100, and a Pixel Definition Layer (PDL) 240 is further arranged on the back plate 150.

In the above solution, the first wire 310, the second wire 320, and the first electrode 210 can be formed through a single patterning process, so that the manufacturing process can be simplified. It should be appreciated that, in the implementation, the first wire 310, the second wire 320, and the first electrode 210 may be respectively located in different layers, and materials for the first wire 310, the second wire 320, and the first electrode 210 are also not limited.

In addition, in an optional embodiment provided by the present disclosure, as shown in FIG. 3, each of the stretchable display substrates further includes: an encapsulation layer 400, wherein the first electrode 210, the second electrode 220, and the light-emitting layer 230 in each of the display pixel units 200 are separately encapsulated by the encapsulation layer 400.

In the above solution, as shown in FIG. 3, each of the individual isolated regions 130 may correspond to three colors of R, G, and B, and the corresponding first electrode 210 and the corresponding second electrode 220 on each of the isolated regions 130 may be separately provided, such that each of the isolated regions 130 may be separately encapsulated to ensure that the encapsulation structure is water proof and oxygen proof.

In addition, as shown in FIG. 3, in an optional embodiment provided by the present disclosure, each of the display pixel units 200 further includes: a connection electrode 510, wherein the connection electrode 510 and the first electrodes 210 are arranged in a same layer and made of a same material, and the connection electrode 510 is configured to be electrically connected to the second wire 320; and a convex structure arranged on a side of the connection electrode 510 distal to the base substrate 100, wherein the convex structure is arranged at a periphery of the light-emitting layer, the convex structure is arranged at a periphery of the light-emitting layer, and the convex structure includes a portion of the pixel definition layer 240 arranged on a side of the back plate 150 distal to the base substrate 100, and a planarization layer 520 arranged on a side of the portion of the pixel definition layer 240 distal to the back plate 150. The convex structure is separated from the connection electrode 510 and the second electrode 220, the second electrode 220 is arranged on a side of the first electrode 210 distal to the base substrate 100, and the second electrode 220 is configured to be in direct physical contact with and electrically connected to the connection electrode 510.

In the above solution, as shown in FIG. 3, there is an exposed connection electrode 510, which is inside the display pixel unit 200, outside the first electrode 210, and within an encapsulation region of the encapsulation layer 400. The connection electrode 510 is electrically connected to the second wire 320, the second electrode 220 is subjected to an evaporation process after the luminescent material is subjected to an evaporation process, so that the second electrode 220 is in contact with the exposed connection electrode 510, so as to implement a connection loop between the second electrode 220 and the second wire 320.

The connection electrode 510, the first electrode 210, the first wire 310, and the second wire 320 may be arranged in a same layer and made of a same material, such that the connection electrode 510 may also be formed through a mask of the first electrode 210, and thus there is no material of the second electrode 220 outside the encapsulation region, and the encapsulation layer 400 can be closely combined with the periphery. Alternatively, the connection electrode 510 and the second electrode 220 may be made of a same material.

In addition, it should be noted that the convex structure including the portion of the pixel definition layer 240 and the planarization layer 520 is arranged within the encapsulation region of the encapsulation layer 400 and is located at the periphery of the light-emitting layer 230, so as to flatten the light-emitting layer 230, and enable the second electrode 220 to be formed on the light-emitting layer 230 and the planarization layer 520. Further, the convex structure is arranged at the periphery of the independent pixel unit, and separated from the connection electrode 510 and the cathode 220, so as to prevent the ink of inkjet printing during the encapsulation from overflowing, and prevent oxygen and moisture from entering the encapsulated structure to improve quality of the product. In an implementation, the distance between the convex structure and the connection electrode 510 as well as the cathode 220 may be in a range from 10 microns to 100 microns, and each pixel unit may be covered independently through the mask when the cathode is subjected to the evaporation process.

In addition, as shown in FIGS. 2 and 3, at least two connection electrodes 510 may be optionally arranged on each of the isolated regions 130 to ensure that a stable potential is provided.

In addition, it should be noted that, in the embodiments provided by the present disclosure, the first division region 110 and the second division region 120 may be hollow structures, that is, the first division region 110 and the second division region 120 may be empty regions, or may be filled with an elastic material such as Polydimethylsiloxane (PDMS) or the like. Thus, since the first division region 110 and the second division region 120 are hollow structures or filled with a stretchable elastic material, the originally non-stretchable base substrate 100 may have a stretching ability. However, when the elastic material is filled, there is still a possibility of poor adhesion during stretching, the wire still needs to be arranged around the display pixel unit 200.

Figure 4:
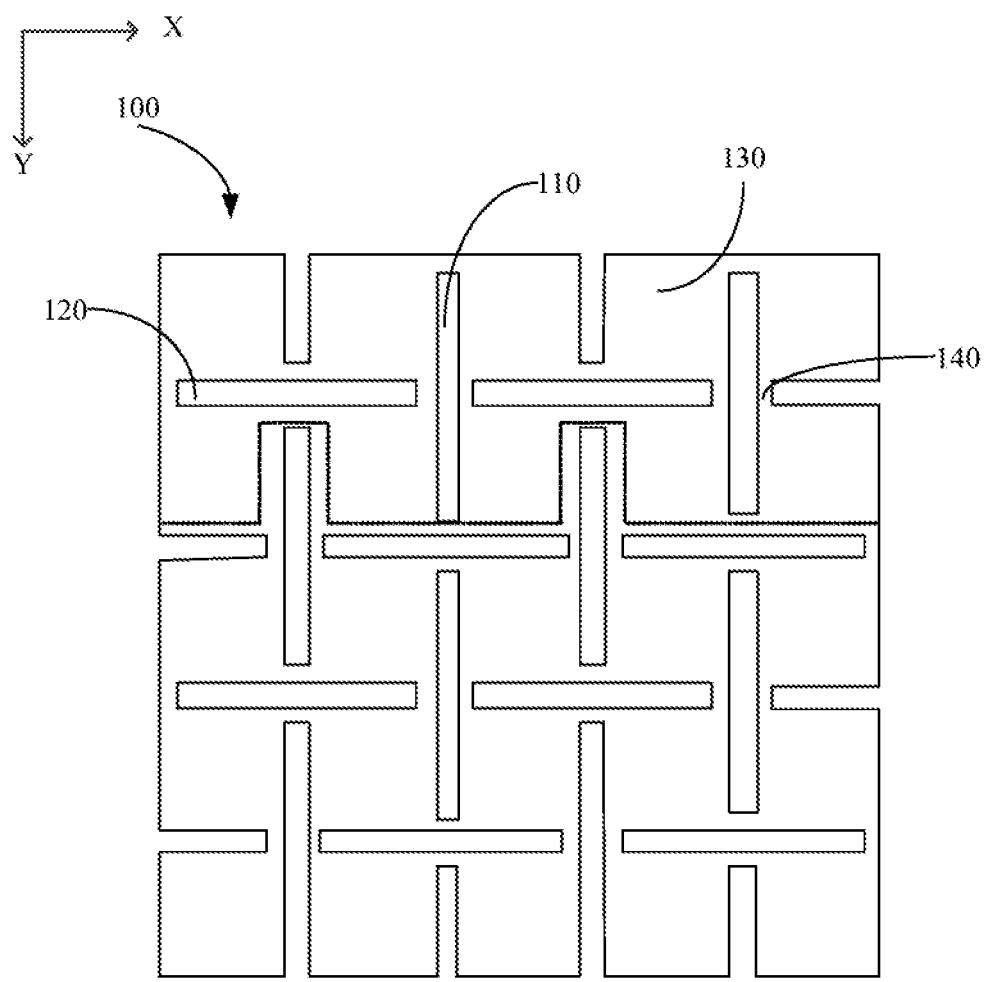
FIG. 4 is a schematic diagram showing a wiring arrangement of the stretchable display substrate in the embodiment of the present disclosure.

In order to enable the display substrate to be stretchable in both the horizontal and vertical directions (as shown in FIG. 4, an X direction is a horizontal direction, and a Y direction is a vertical direction, the horizontal and vertical directions are row and column directions in which the isolated regions 130 are arranged in an array, where only the structure of the base substrate is illustrated in FIG. 4, and the display pixel units are not shown in FIG. 4), it is generally required to arrange the first division region 110 and the second division region 120 into two directions. For example, the first division region 110 may be arranged in the horizontal direction, and the second division region 120 may be arranged in the vertical direction, while the first division region 110 and the second division region 120 in the horizontal and vertical directions are orthogonally arranged and periodically repeated, as shown in FIG. 4. In this way, in order to avoid the empty region where the first division region 110 and the second division region 120 are located or the region filled with the elastic material, the wires in the horizontal and vertical directions (including the first wire 110 and the second wire 120, and/or the third wire 130) need to be arranged around the display pixel unit 200 to control the display pixel units 200 on a same row or same column.

Figure 5:
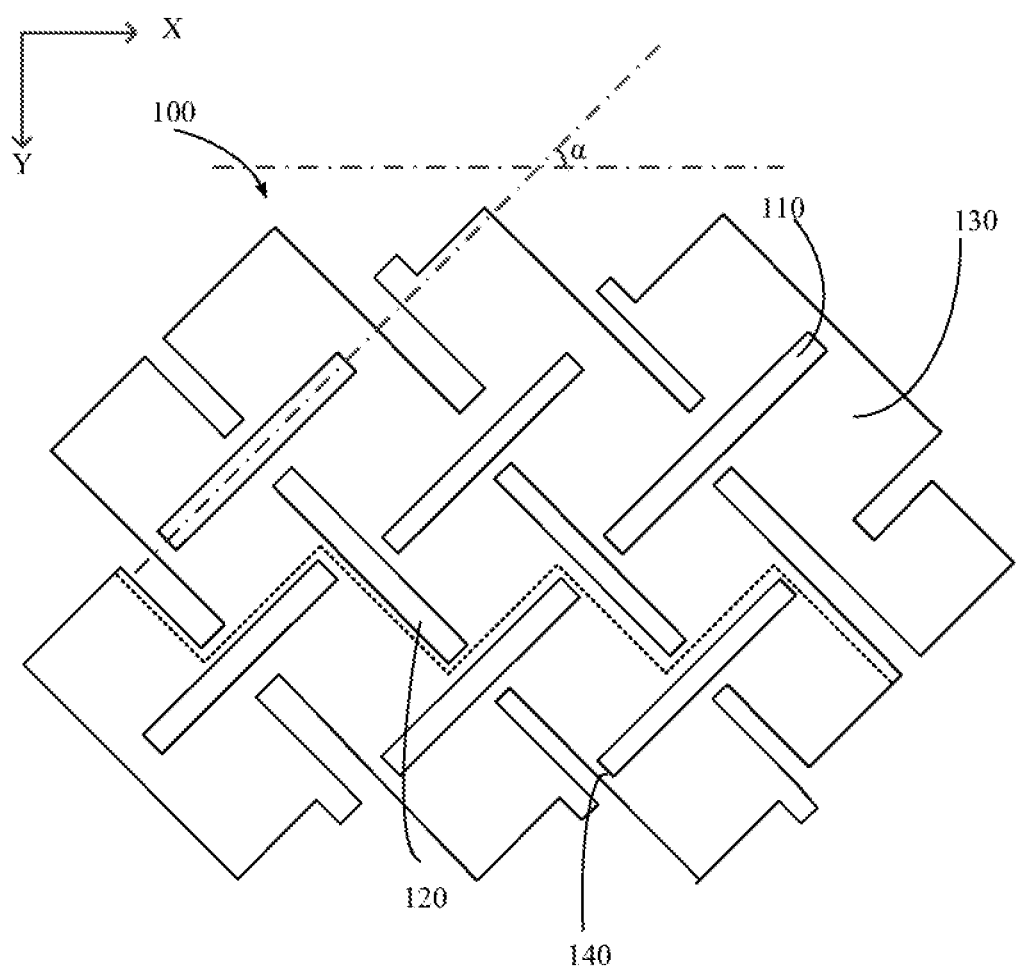
FIG. 5 is a schematic diagram showing a wiring arrangement of the stretchable display substrate in another embodiment of the present disclosure.

FIG. 5 is a schematic diagram of a structure of a stretchable display substrate in another embodiment provided by the present disclosure, in which only a base substrate is illustrated, and the display pixel units is not schematically illustrated. In order to solve the above problem, in an optional embodiment provided by the present disclosure, as shown in FIG. 5, there is an oblique angle α between an extending direction of the first division region 110 and a row direction of the isolated regions 130, and an extending direction of the second division region 120 is perpendicular to the extending direction of the first division region 110. As shown in FIG. 5, the oblique angle α is an angle between a generally extending direction of the wire (i.e., the dotted zigzag line in FIG. 5) and an extending direction of the first division region 110, and the generally extending direction of the wire is a mainly extending direction of the wire in whole of the base substrate 110. In particular, in the embodiment of FIG. 5, the generally extending direction of the wire is the horizontal direction.

In the above solution, as shown in FIG. 5, the plurality of isolated regions 130 on the base substrate are arranged in an array and have a row direction and a column direction, wherein an electrical signal may be applied between the display pixel units 200 on the plurality of the isolated regions 130 in a same row through a same signal wire (e.g., a gate line), the row direction refers to a first arrangement direction of the isolated regions connected by the same signal wire in the plurality of isolated regions arranged in the array. An electrical signal can be applied between the display signal unit 200 on the plurality of the isolated regions 130 in a same column through the same signal wire (e.g., a data line), the column direction refers to a second arrangement direction of the isolated regions connected by the same signal wire in the plurality of isolated regions arranged in the array, where the row direction is perpendicular to the column direction. For example, in FIG. 5, the row direction is an X direction, and the column direction is a Y direction. In the above solution, orientations of the first division region 110 and the second division region 120 configured for dividing the individual isolated regions 130 may be changed, and the first division region 110 is designed to provide the oblique angle α between a extending direction of the first division region 110 and a row direction of the plurality of isolated regions 130, that is, the first division region 110 is designed to extend in an oblique direction, the second division region 120 is perpendicular to the first division region 110, and the first division region 110 and the second division region 120 in both directions remain periodically arranged, so that the wire for the display pixels units 200 in the same row or the same column may be arranged in a zigzag manner. As shown in FIG. 5, the wire for the display pixel units 200 in the same row are arranged in the zigzag manner as indicated by a dotted line shown in FIG. 5. In this way, it not only ensures controllability of the pixels in the single row or the single column, but also shortens a length of the wire. At the same time, when the first division regions 110 and the second division regions 120 are in oblique directions and vertical to each other, and when the stretching is implemented in the horizontal and vertical directions, combined strain in two oblique directions can also meet requirements of horizontally and vertically stretching.

In an embodiment of the present disclosure, the oblique angle α is 45 degrees or about 45 degrees. In this way, the length of the wire can be minimized. Moreover, a wire extending manner of any one of the display pixel units 200 is same as a wire extending manner of any other one of the display pixel units 200, and the extending directions of the wires alter uniformly. It should be appreciated that, in implementation, the oblique angle α may alternatively be other than about 45 degrees, and in a range between 0 degrees and 90 degrees.

In addition, a display device including the stretchable display substrate provided is further provided in the embodiments of the present disclosure. Further, the display device may be any product or component that has a display function, such as a mobile phone, a tablet computer, a television, a display, a notebook computer, a digital frame, or a navigation device.

In addition, a method for manufacturing the stretchable display substrate is provided in the embodiments of the present disclosure, and the method includes: providing the base substrate 100 on which the plurality of first division regions 110 and the plurality of second division regions 120 are arranged, wherein the first division regions 110 intersect the second division regions 120, the first division regions 110 and the second division regions 120 are not directly connected to each other, the base substrate 100 is divided into the plurality of isolated regions 130 and the plurality of connection regions 140 through the first division regions 110 and the second division regions 120, and the isolated regions 130 are arranged in the first array, and connected to each other through the connection regions 140; and forming, on the base substrate 100, the plurality of display pixel units 200 and the plurality of wires configured to electrically connect the plurality of display pixel units 200, wherein each of the isolated regions 130 corresponds to at least one of the display pixel units 200, and each of the display pixel units 200 includes the first electrode 210 and the second electrode 220 arranged opposite to each other, and the light-emitting layer 230 arranged between the first electrode 210 and the second electrode 220, and the plurality of wires includes the first wires 310 and the second wires 320, the first electrodes 210 are connected through the first wire 310 arranged on the connection regions 140 and the isolated regions 130, and the second electrodes 220 are connected through the second wire 320 arranged on the connection regions 140 and the isolated regions 130.

In the above solution, the base substrate 100 is made of a flexible material, and a plurality of individual isolated regions 130 and the connection regions 140 connected between the isolated regions 130 are arranged on the base substrate 100, and a wire extends through the connecting regions 140 among the isolated regions 130. When subjected to an external force, a distance between the isolated regions 130 becomes larger, and the connecting regions 140 are still connected to each other to ensure integrity of the entire stretchable display substrate. As compared to a flat display substrate in the related art, in the stretchable display substrate of the embodiments of the present disclosure, a connection part of the second electrode 220 (which can be used as a cathode) is redesigned, the connection region 140 between the isolated regions 130 is used as a transmission path of a signal line, and the second electrode 220 is no longer connected from the edge of the screen, but is connected and signaled through the wire on the connection region 140. FIG. 2 is an enlarged view of a structure of one isolated region 130 in FIG. 1, and FIG. 3 is a cross-sectional view along a line A-A in FIG. 2. As shown in FIGS. 2 and 3, one individual isolated regions 130 is provided with the first wire 310 (which can be used as an anode signal line) and the second wire 320 (which can be used as a cathode signal line). Since potentials of the second electrodes 220 of the entire stretchable display substrate can be regarded as being uniform, both ends of a same display pixel unit 200 can provide a same potential for the second electrode 220 through different connection regions 140. Thus, when the stretchable display substrate is stretched, even if a resistance of the second electrode 220 changes greatly, the wire corresponding to the second electrode 220 is still independently connected to the second electrode 220. Therefore, it can provide good bending fatigue resistance, and solve a problem that a voltage distal to an end of a driving IC drops, so as to provide a stable potential.

Further, in the above method, the first wire 310, the second wire 320 and the first electrodes 210 are formed through a single patterning process.

In the above solution, the first wire 310, the second wire 320, and the first electrode 210 can be formed through a single patterning process, so that the manufacturing process can be simplified. It should be appreciated that, in the implementation, the first wire 310, the second wire 320, and the first electrode 210 may be respectively located in different layers, and formed through different patterning processes. In addition, materials for the first wire 310, the second wire 320, and the first electrode 210 are also not limited.

In addition, the method further includes: forming an encapsulation layer 400 on the base substrate 100, wherein a first electrode 210, a second electrode 220, and a light-emitting layer 230 in each of the display pixel units 200 are separately encapsulated by the encapsulation layer 400.

In the above solution, as shown in FIG. 3, each of the individual isolated regions 130 may correspond to three colors of R, G, and B, and the corresponding first electrode 210 and the corresponding second electrode 220 on each of the isolated regions 130 may be separately provided, such that each of the isolated regions 130 may be separately encapsulated to ensure that the encapsulation structure is water proof and oxygen proof.

In addition, forming on the base substrate 100 the plurality of display pixel units 200 and the plurality of wires configured to electrically connect the plurality of display pixel units 200 includes: forming a first electrode 210 and a connection electrode 510 on the base substrate 100, wherein the connection electrode 510 is configured to be electrically connected to a second wire 320; forming a light-emitting layer 230 on the first electrode 210, and forming a convex structure on the connection electrode 510 and at a periphery of the light-emitting layer; and forming a second electrode 220 on the light-emitting layer 230 and the convex structure, wherein the second electrode 220 is configured to be in direct physical contact with and electrically connected to the connection electrode 510.

In the above solution, as shown in FIG. 3, there is an exposed connection electrode 510, which is inside the display pixel unit 200, outside the first electrode 210, and within an encapsulation region of the encapsulation layer 400. The connection electrode 510 is electrically connected to the second wire 320, the second electrode 220 is subjected to an evaporation process after the luminescent material is subjected to an evaporation process, so that the second electrode 220 is in contact with the exposed connection electrode 510, so as to implement a connection loop between the second electrode 220 and the second wire 320.

In an embodiment of the present disclosure, the connection electrode 510, the first electrode 210, the first wire 310, and the second wire 320 may be arranged in a same layer and made of a same material, such that the connection electrode 510 may also be formed through a mask of the first electrode 210, and thus there is no material of the second electrode 220 outside the encapsulation region, and the encapsulation layer 400 can be closely combined with the periphery.

In addition, as shown in FIG. 3, at least two connection electrodes 510 may be optionally arranged on each of the isolated regions 130 to ensure that a stable potential is provided.

The above are merely optional embodiments of the present disclosure, and it should be noted that a person skilled in the art can make various improvements and substitutions without departing from the principles of the present disclosure, and these improvements and substitutions should also be considered as falling into the protection scope of the present disclosure.

What is claimed is:

1. A stretchable display substrate, comprising:
   a base substrate on which a plurality of isolated regions and a plurality of connection regions are distributed, wherein the isolated regions are connected to each other through the connection regions;
   a plurality of display pixel units arranged in a first array, wherein at least a respective one of the display pixel units is arranged on each of the isolated regions, at least one of the display pixel units comprises an independent cathode, and the independent cathode is separated from any cathode of the other display pixel units; and
   at least one wire configured to be electrically connected to the independent cathode,
   wherein a plurality of first division regions and a plurality of second division regions are arranged on the base substrate, wherein the first division regions intersect the second division regions, the first division regions and the second division regions are not directly connected to each other, the base substrate is divided into the isolated regions arranged in a second array and the connection regions through the first division regions and the second division regions;
   each of at least part of the plurality of display pixel units further comprises an anode arranged opposite to the cathode, and a light-emitting layer arranged between the anode and the cathode, and the at least one wire comprises a first wire and a second wire, wherein the anodes are connected through the first wire arranged on the connection regions and the isolated regions, and the cathodes are connected through the second wire arranged on the connection regions and the isolated regions,
   wherein each of the plurality of display pixel units further comprises:
   a connection electrode configured to be electrically connected to the second wire; and
   a convex structure arranged on a side of the connection electrode distal to the base substrate, wherein the convex structure is arranged at a periphery of the light-emitting layer, a back plate is arranged on the base substrate, and the convex structure comprises a portion of an pixel definition layer arranged on a side of the back plate distal to the base substrate, and a planarization layer arranged on a side of the portion of the pixel definition layer distal to the back plate,
   wherein the convex structure is separated from the connection electrode and the cathode, the cathode is arranged on a side of the anode distal to the base substrate, and the cathode is configured to be in direct physical contact with and electrically connected to the connection electrode.

2. The stretchable display substrate according to claim 1, wherein
   there is an oblique angle between a generally extending direction of the wire and an extending direction of the first division region.

3. The stretchable display substrate according to claim 2, wherein
   the isolated region is of a rectangle, two opposite sides of the rectangle are parallel to the extending direction of the first division region, and the other two opposite sides of the rectangle are parallel to the extending direction of the second division region.

4. The stretchable display substrate according to claim 2, wherein
   wires configured to be electrically connected to adjacent isolated regions are of an equal length, the wire for the display pixel units in a same row is of a shape of a zigzag line, the zigzag line comprises a plurality of first line segments and a plurality of second line segments, the first line segments and the second line segments are connected to each other alternately, the first line segments are parallel to the extending direction of the first division region, and the second line segments are parallel to the extending direction of the second division region.

5. The stretchable display substrate according to claim 2, wherein
the oblique angle is about 45 degrees.

6. The stretchable display substrate according to claim 1, wherein
the first wire, the second wire, and the anode are arranged in a same layer and made of a same material.

7. The stretchable display substrate according to claim 1, further comprising:
an encapsulation layer, wherein the anode, the cathode, and the light-emitting layer in each of the display pixel units are separately encapsulated by the encapsulation layer.

8. The stretchable display substrate according to claim 1, wherein
the first division regions and the second division regions are hollow regions formed in the base substrate.

9. The stretchable display substrate according to claim 8, wherein
the hollow regions are filled with an elastic material.

10. The stretchable display substrate according to claim 1, wherein
the first division regions and the second division regions are strip-shaped regions.

11. The stretchable display substrate according to claim 10, wherein
the plurality of first division regions are arranged in a plurality of first rows that are parallel to each other, and in each of the plurality of first rows, at least two corresponding first division regions of the plurality of first division regions are arranged along an extending direction of the first row; and
the plurality of second division regions are arranged in a plurality of first columns that are parallel to each other, and in each of the plurality of first columns, at least two corresponding second division regions of the plurality of second division regions are arranged along an extending direction of the first column.

12. The stretchable display substrate according to claim 11, wherein
one of the first division regions located in one of the first rows and another one of the first division regions located in another one of the first rows adjacent to the one of the first rows are staggered, and one of the second division regions located in one of the first columns and another one of the second division regions located in another one of the first columns adjacent to the one of the first columns are staggered.

13. The stretchable display substrate according to claim 11, wherein
the first row is perpendicular to the first column.

14. The stretchable display substrate according to claim 1, wherein
shapes of the plurality of first division regions are same, and shapes of the plurality of second division regions are same;
one or more of the connection regions are directly connected to the isolated regions, the first division regions, and the second division regions.

15. A display device comprising the stretchable display substrate according to claim 1.

16. A method for manufacturing a stretchable display substrate, comprising:
providing a base substrate;
forming a plurality of isolated regions and a plurality of connection regions on the base substrate, wherein the isolated regions are connected to each other through the connection regions;
forming a plurality of display pixel units on the base substrate, wherein the display pixel units are arranged in a first array, at least a respective one of the display pixel units is arranged on each of the isolated regions, at least one of the display pixel units comprises an independent cathode, and the independent cathode is separated from any cathode of the other display pixel units; and
forming at least one wire, wherein the at least one wire is configured to be electrically connected to the independent cathode,
wherein a plurality of first division regions and a plurality of second division regions are arranged on the base substrate, wherein the first division regions intersect the second division regions, the first division regions and the second division regions are not directly connected to each other, the base substrate is divided into the isolated regions arranged in a second array and the connection regions through the first division regions and the second division regions;
each of at least part of the plurality of display pixel units further comprises an anode arranged opposite to the cathode, and a light-emitting layer arranged between the anode and the cathode, and the at least one wire comprises a first wire and a second wire, wherein the anodes are connected through the first wire arranged on the connection regions and the isolated regions, and the cathodes are connected through the second wire arranged on the connection regions and the isolated regions,
wherein each of the plurality of display pixel units further comprises:
a connection electrode configured to be electrically connected to the second wire; and
a convex structure arranged on a side of the connection electrode distal to the base substrate, wherein the convex structure is arranged at a periphery of the light-emitting layer, a back plate is arranged on the base substrate, and the convex structure comprises a portion of an pixel definition layer arranged on a side of the back plate distal to the base substrate, and a planarization layer arranged on a side of the portion of the pixel definition layer distal to the back plate,
wherein the convex structure is separated from the connection electrode and the cathode, the cathode is arranged on a side of the anode distal to the base substrate, and the cathode is configured to be in direct physical contact with and electrically connected to the connection electrode.

17. The method according to claim 16, wherein forming the plurality of display pixel units and the at least one wire on the base substrate comprises: with respect to each of at least part of the plurality of display pixel units,
forming the first wire, the second wire, and the anode through a single patterning process; and
forming the light-emitting layer and the cathode sequentially on the side of the anode distal to the base substrate,
wherein the first wire is formed in the connection regions and the isolated regions to connect the anodes, and the second wire is formed in the connection regions and the isolated regions to connect the cathodes.

\* \* \* \* \*